(12) United States Patent
Ayya et al.

(10) Patent No.: US 10,553,192 B2
(45) Date of Patent: Feb. 4, 2020

(54) HUM REDUCTION CIRCUIT AND METHOD

(71) Applicant: SYNAPTICS INCORPORATED, San Jose, CA (US)

(72) Inventors: Chandrashekar Reddy Ayya, Irvine, CA (US); Lorenzo Crespi, Costa Mesa, CA (US); Brian Walter Friend, Carlsbad, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 15/861,598

(22) Filed: Jan. 3, 2018

(65) Prior Publication Data

US 2018/0190256 A1 Jul. 5, 2018

Related U.S. Application Data

(60) Provisional application No. 62/441,892, filed on Jan. 3, 2017.

(51) Int. Cl.
*G10K 11/16* (2006.01)
*H04R 1/06* (2006.01)
*H04M 3/18* (2006.01)

(52) U.S. Cl.
CPC .............. *G10K 11/16* (2013.01); *H04R 1/06* (2013.01); *H04M 3/18* (2013.01); *H04R 2460/01* (2013.01)

(58) Field of Classification Search
CPC . H03F 3/38; H03F 3/217; H03F 21/00; H03F 3/2171; H03F 3/085; H03F 3/2173; H03F 1/0211; H02M 3/28; H02M 2001/007; G10K 11/16; G10K 11/175; G10K 11/1783; G10K 11/17833; G10K 11/17835; G10K 11/17853; G10K 11/17861; G10K 11/1787; H04R 1/06; H04R 2420/03; H04R 2420/05; H04R 2420/09; H04R 2460/01; H04M 3/18
USPC ......... 381/74, 312, 314, 317, 318, 322, 323, 381/123, 28, 56, 59, 61, 319, 321, 84, 86, 381/102, 104, 120, 71.6, 71.1, 71.3, 71.9, 381/71.13, 94.1-94.9, 73.1, 75, 76; 330/251, 297, 123, 127, 130, 134, 140,
(Continued)

(56) References Cited

U.S. PATENT DOCUMENTS

| 4,814,647 A | 3/1989 | Tran |
| 4,845,750 A * | 7/1989 | Ecklund ................. H04H 20/49 381/15 |
| 9,319,768 B2 | 4/2016 | Larsen et al. |

(Continued)

*Primary Examiner* — Leshui Zhang
(74) *Attorney, Agent, or Firm* — Haynes and Boone, LLP

(57) ABSTRACT

Systems and methods according to one or more embodiments are provided for a hum reduction circuit implemented to provide a ground path between an audio generating device and a powered headset. In one example, a system includes a jack configured to accept a plug comprising a first electrical ground connection. The system also includes a switch coupled to the jack at a first end and coupled to second electrical ground connection at a second end. The system also includes the switch is configured to couple to the first electrical ground at the first end. The system further includes a bias control signal coupled to the switch, configured to control a switch bias, where a first switch bias electrically couples the first electrical ground to the second electrical ground, and a second switch bias electrically decouples the first electrical ground from the second electrical ground.

20 Claims, 4 Drawing Sheets

(58) Field of Classification Search
USPC .............. 330/207 A; 348/725, 730, E5.127; 700/94
See application file for complete search history.

(56) References Cited

U.S. PATENT DOCUMENTS

| | | |
|---|---|---|
| 9,407,256 B2 | 8/2016 | Körner et al. |
| 2010/0097148 A1* | 4/2010 | Ye .......................... H03F 1/025 330/297 |
| 2013/0063186 A1 | 3/2013 | DeBeer et al. |
| 2013/0142350 A1* | 6/2013 | Larsen ................ H04R 1/1041 381/74 |
| 2014/0369520 A1 | 12/2014 | Elwart, II et al. |
| 2015/0249876 A1* | 9/2015 | Hogan .................... H02M 3/07 381/123 |

\* cited by examiner

HUM REDUCTION CIRCUIT AND METHOD

CROSS-REFERENCE TO RELATED APPLICATIONS

This application claims the benefit of and priority to U.S. Provisional Patent Application No. 62/441,892 filed Jan. 3, 2017 and entitled "HUM REDUCTION CIRCUIT AND METHOD" which is incorporated herein by reference in its entirety.

TECHNICAL FIELD

The present invention relates generally to audio signal processing and, more particularly, to the reduction of hum noise in audio processing systems.

BACKGROUND

Many modern devices such as laptop computers, tablets, and mobile phones provide audio jack connections for receiving headsets and other audio equipment that may be selectively connected during operation. When power to the device's audio processing components is off, a resulting low frequency ground noise or "hum" may be present on the headset when the analog plug of a powered headset or speaker is inserted into the powered-off audio components. In addition, when power is removed from the audio components, a popping sound may be heard at the connected headset device creating an uncomfortable listening experience. Thus, there is a need in the art for improved solutions that prevent unwanted noise in connected audio devices.

SUMMARY

The present disclosure describes systems and methods that address a need in the art of audio signal processing circuits and methods that reduce undesired hum and pop noise. The audio system of the present disclosure includes an audio detection circuit to detect a plug configuration of a headset or speaker connected to the audio generating components of a device or system such as a laptop or mobile device. In one embodiment, a hum reduction circuit is implemented to provide a ground path between unpowered audio generating components and the powered headset or speaker plugged into the device or system.

In one or more embodiments, a system comprises a jack adapted to accept a plug comprising a first electrical ground connection, a switch coupled to the jack at a first end and coupled to a second electrical ground connection at a second end, wherein the switch is operable to couple to the first electrical ground connection at the first end, and a bias control source. The bias control source is operable to generate a bias control signal and is coupled to the switch and operable to control a switch bias. A first switch bias electrically couples the first electrical ground connection to the second electrical ground connection, and a second switch bias electrically decouples the first electrical ground connection from the second electrical ground connection.

The system may further comprise a charge pump coupled to the switch and operable to generate the bias control signal comprising a negative voltage bias control signal and a positive bias control signal. The charge pump may be operable to provide the negative voltage bias control signal to the switch to electrically decouple the first electrical ground connection from the second electrical ground connection, and provide the positive voltage bias control signal to the switch to electrically couple the first electrical ground to the second electrical ground.

The system may further comprise a state machine coupled to the charge pump and operable to detect, at the jack, at least one of a first plug and a second plug. The state machine provides an enable signal to the charge pump when the first plug is detected and a disable signal to the charge pump when the second plug is detected. In various embodiments, the disable signal is a first disable signal, and the system further comprises a power-on reset circuit coupled to the charge pump comprising one or more power supply voltage signals at corresponding one or more input ports of the power-on reset circuit, and operable to provide a second disable signal to the charge pump in response to a power supply voltage signal.

In one embodiment, the switch comprises a depletion n-channel field effect transistor including a drain, a source, and a gate. The drain is coupled to the first electrical ground connection at the jack, the source is coupled to the second electrical ground connection, and the gate is coupled to the bias control signal. The depletion n-channel field effect transistor is operable to electrically couple the first electrical ground connection to the second electrical ground connection when no bias control signal is present.

The system may further comprise a fast pull-up circuit coupled to the gate of the depletion n-channel field effect transistor. The fast pull-up circuit is operable to provide a fast rise time voltage signal at the gate in response to the bias control signal.

The jack may be configured as an audio device jack of an audio codec to accept at least one of an open mobile terminal platform (OMTP) plug and a cellular telephone industries association (CTIA) plug. In one embodiment, audio codec is coupled to the second electrical ground connection, and at least one of the OMTP plug and the CTIA plug is coupled to the first electrical ground. The system may also include a direct current (DC) powered speaker coupled to the first electrical ground connection.

A method in accordance with embodiments of the present disclosure comprises accepting at a jack, by a plug coupled to the jack, a first electrical ground connection, and receiving, at a first end of a switch coupled to the jack, the first electrical ground connection. The method further comprises coupling, at a second end of the switch, a second electrical ground connection, providing a bias control signal coupled to the switch to control a switch bias, electrically coupling, by a first switch bias, the first electrical ground connection to the second electrical ground connection, and electrically decoupling, by a second switch bias, the first electrical ground connection from the second electrical ground connection.

The method may further comprise providing, by a charge pump coupled to the switch, a negative voltage bias control signal to decouple the first electrical ground connection from the second electrical ground connection in response to an enable signal, and providing, by the charge pump coupled to the switch, a positive voltage bias control signal to couple the first electrical ground connection to the second electrical ground connection in response to a disable signal.

The method may also comprise detecting, by a state machine coupled to the charge pump, at least one of a first plug and a second plug coupled to the jack. The state machine provides the enable signal to the charge pump when the first plug is detected, and provides the disable signal to the charge pump when the second plug is detected. In one embodiment, the disable signal is a first disable signal, the method further comprises providing, by a power-on reset circuit coupled to the charge pump, a second disable signal in response to a power supply voltage signal at one or more input ports of the power-on reset circuit.

In one embodiment of the method, the switch is configured as a depletion n-channel field effect transistor comprising a drain, a source, and a gate, and the drain is coupled to the first electrical ground connection at the jack, the source is coupled to the second electrical ground connection, and the gate is coupled to the bias control signal. The method may further comprise electrically coupling the first electrical ground connection to the second electrical ground connection when no bias control signal is present. The method may further comprise providing, by a fast pull-up circuit, a fast rise time voltage signal to the gate to electrically couple the first electrical ground connection to the second electrical ground connection in response to the bias control signal.

In one embodiment, the jack is configured as an audio device jack of an audio codec to accept at least one of an open mobile terminal platform (OMTP) plug and a cellular telephone industries association (CTIA) plug. The audio codec is coupled to the second electrical ground connection, and at least one of the OMTP plug and the CTIA plug is coupled to the first electrical ground connection. The method may also comprise a direct current (DC) powered speaker coupled to the first electrical ground connection.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

Figure 1:
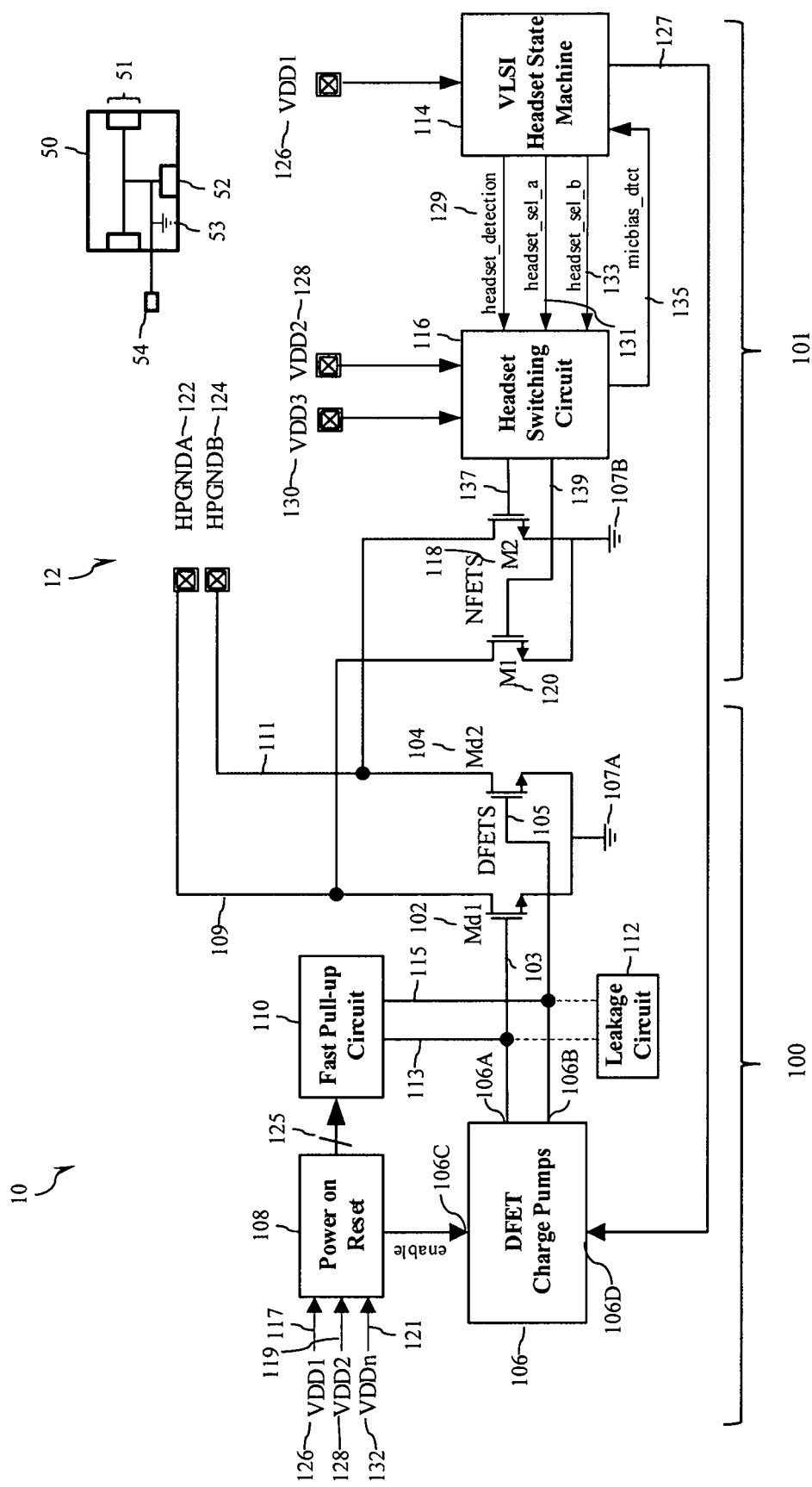
FIG. 1 illustrates a schematic diagram of an audio system including hum reduction circuitry in accordance with an embodiment of the disclosure.

The included drawings are for illustrative purposes and serve only to provide examples of possible systems and methods for the disclosed methods and system for providing hum reduction circuitry. These drawings in no way limit any changes in form and detail that may be made to that which is disclosed by one skilled in the art without departing from the spirit and scope of this disclosure.

DETAILED DESCRIPTION

The present disclosure describes systems and methods that address a need in the art of audio signal processing circuits and methods that reduce undesired hum and pop noise. The audio system of the present disclosure includes an audio detection circuit to detect a plug configuration of a headset or speaker connected to the audio generating components of a device or system such as a laptop or mobile device. In one embodiment, a hum reduction circuit is implemented to provide a ground path between unpowered audio generating components and the powered headset or speaker plugged into the device or system.

In some embodiments, the hum reduction circuit is used with a jack detection circuit, where the jack detection circuit detects a configuration of a headset plugged into a jack of the device. In one embodiment, the jack detection circuit is implemented in accordance with techniques set forth in U.S. Pat. No. 9,319,768 which is hereby incorporated by reference in its entirety. The jack detection circuit described therein includes a VLSI headset state machine and supporting headset switching circuitry. The jack detection circuit may be used to detect a headset type plugged into the device and provide a low resistance ground path to the headset as determined by headset detection logic of the state machine. The low resistance ground path is provided by n-channel field effect transistors (NFETs) that function as audio ground switches when the audio components are powered on.

The hum reduction circuit of the present disclosure may support various headset types. When supporting a multi-standard headset, ground and microphone signals of the various headset types may be assigned to different contacts on a headset jack of the device. In one embodiment, the headset detection logic can cycle through two selections (such as headset selection A and headset selection B) and determine the headset type plugged into the audio device headset jack by monitoring the output current of the headset microphone bias amplifier provided at the headset jack. For example, for an OMTP headset configuration with an OMTP plug, ring2 of the headset jack may be assigned to a mono microphone of the headset and a sleeve of the headset jack may be assigned to ground. For a CTIA headset configuration with a CTIA plug, ring2 of the headset jack may be assigned to ground and the sleeve may be assigned to the mono microphone. Other suitable headset configurations can also or alternatively be used.

In various embodiments, the hum reduction circuit includes depletion mode n-channel field effect transistors (DFET) that function as audio ground switches to provide local grounding of the headset when the audio components are powered off. The DFET switch is used to connect the ground assigned to the contact of the headset jack to the audio component's local ground. In this regard, a low resistance path to ground is provided to remove or reduce low frequency ground noise that may be generated when a powered speaker of a headset is plugged into the unpowered audio components.

In various embodiments, a charge pump is coupled to each DFET to control the DFET. Each charge pump includes two charge pump circuits implemented in series to provide a noise free voltage bias control signal to the gate of the DFET. The charge pump is powered by a positive power source internal to the audio components. Each charge pump may be implemented using conventional circuits to provide a negative voltage bias control signal and a positive voltage bias control signal to the gate. When enabled, the charge pump produces a negative voltage bias control signal to turn off the n-channel DFET. When disabled, the charge pump produces a positive voltage bias control signal to turn on the n-channel DFET.

In some embodiments, the charge pump operation is controlled by the VLSI headset state machine. The VLSI headset state machine is coupled to the charge pump to provide logic enable and logic disable signals. As discussed herein, the VLSI headset state machine provides for jack detection to detect a headset type plugged into the device headset jack. NFETs of the jack detection circuit function as audio ground switches when the audio components are powered on. VLSI headset state machine may produce a disable signal at the control input to the charge pump connected to the DFET assigned to the ground contact of the headset plug configuration. In this regard, the DFET connected to the ground contact of the headset plug configuration (e.g., based on the DFET connected to ring2 or sleeve of the headset jack) couples the headset ground to the audio component's local ground. In addition, VLSI headset state machine produces a logic enable signal at the control input to the charge pump connected to the DFET assigned to the microphone of the headset plug configuration to turn off the DFET to prevent grounding the microphone input. In some embodiments, DFET switches of hum reduction circuit are biased in a conductive ON state when no bias control signal is present at the gate input.

In some embodiments, the hum reduction circuit includes a power-on reset circuit provided to monitor audio device internal system power supplies and provide a logic (e.g., a logic enable or a logic disable) signal to each charge pump circuit in response to variations in internal power supply voltage signals. The power-on reset circuit may be implemented from conventional analog and digital logic circuitry. In this regard, a power supply low voltage magnitude threshold may be set for each internal power supply. The internal power supplies may be provided to a logical AND gate input to the power-on reset circuit. In its quiescent state (e.g., where internal power supplies exceed their respective low voltage magnitude threshold) the power-on reset circuit may produce a logic enable output signal to charge pumps to turn off DFET circuits. Alternatively, when one or more internal power supplies fall below their respective low voltage magnitude threshold, power-on reset circuit produces a logic disable output signal to charge pumps to turn on each DFET circuit and couple the audio component's local ground to the headset ground.

In some embodiments, the hum reduction circuit includes a fast pull-up circuit to provide a fast rise time voltage signal to the gate of DFET switch. For example, when the audio device is switched off, the NFETS functioning as the main headset ground switches turn off immediately. However, the DFETs turn on slowly in response to the charge pump control voltage signal due to time required to charge transistor parameter capacitances. The resulting instantaneous current through the speaker in the headset due to the headset ground momentarily floating causes a POP sound to be heard at the speaker. To avoid the POP at the speaker when the audio components are initially turned off, a logic circuit acting as a fast bias control signal pull-up along with a leakage device is used to quickly pull up the voltage bias control signal at the gate of the DFET switches. When the audio components are switched off, the fast pull-up circuit pulls the voltage at the gate of the DFET to the appropriate voltage, turning on the DFET switch. Additionally, a leakage circuit provided at the gate of the DFET switch aids to keep the DFET biased on while audio components are turned off.

As used herein, the term "couple" and its cognate terms such as "couples" and "coupled" can include a direct connection, a connection through intervening devices or elements, a hard-wired connection, an integrated circuit connection, a bus or other suitable connections.

FIG. 1 illustrates a schematic diagram of an audio system 10 including a hum reduction circuit 100 in accordance with an embodiment of the disclosure. Audio system 10 is a device, such as a mobile phone, laptop computer, tablet, or audio/video system, which includes an embedded audio codec that supports headset 50. Headset 50 may include stereo headphones 51 and a mono microphone 52. Hum reduction circuit 100 may be used with jack detection circuit 101 to electrically couple audio components local ground 107A of audio system 10 to a headset ground 53 to reduce or remove a low frequency ground noise or audible "hum". Ground noise or audible hum may appear when a headset plug 54 of powered headset 50 is inserted into an unpowered audio jack 12 including an audio device jack contact HPGNDA 122 or an audio device jack contact HPGNDB 124 of audio system 10.

In some embodiments, hum reduction circuit 100 includes depletion n-channel field effect transistors (DFET) 102 and 104. DFETs 102/104 may couple local ground 107A to headset ground 53 when headset plug 54 is in contact with contacts HGNDA 122 and HGNDB 124. For example, source electrode of Md1 DFET 102 is coupled to local ground 107A. Drain electrode of DFET 102 is coupled to an audio device jack contact HPGNDA 122 by trace (e.g., lead) 109. Gate electrode of Md1 DFET 102 is coupled to DFET charge pumps output port 106A. When headset plug 54 is coupled to contact HPGNDA 122 and DFET 102 is biased to its conductive ON state, DFET 102 may couple local ground 107A to headset ground 53 through DFET 102 low resistance source to drain path. DFET charge pump 106 provides a control signal 103 (i.e. voltage) to gate electrode of DFET 102 to bias DFET 102 to a low resistance conductive ON state, or conversely bias DFET 102 to a high impedance OFF state. In this regard, DFET 102 provides a selectively controllable switch to couple audio components local ground 107A to headset ground 53 through audio device jack contact HPGNDA 122.

Similarly, source electrode of Md2 DFET 104 is coupled to local ground 107A. Drain electrode of DFET 104 is coupled to audio device jack contact HPGNDB 124 by trace (e.g., lead) 111. Gate electrode of Md2 DFET 104 is coupled to DFET charge pumps output port 106B. When headset plug 54 is coupled to contact HPGNDB 124, and DFET 104 is biased to its conductive ON state, DFET 104 may couple local ground 107A to headset ground 53 through DFET 104 low resistance source to drain path. DFET charge pump 106 provides a control voltage signal 105 to gate electrode of DFET 104 to bias DFET 104 to a low resistance conductive ON state, or conversely bias DFET 104 to a high impedance OFF state. In this regard, DFET 104 provides a selectively controllable switch to couple local ground 107A to headset ground 53 through audio jack contact HPGNDA 124.

In some embodiments, DFET charge pumps 106 provide bias control signals 103/105 to DFETs 102/104, respectively. Bias control signals 103/105 may include a positive voltage bias control signal to bias DFET 102/104 in a conductive ON state as discussed herein. Control signals 103/105 may include a negative voltage bias control signal to bias DFET 102/104 in a high impedance OFF state. Charge pumps 106 provide bias control signals 103/105 in response to logic signal inputs received at charge pumps input ports 106C and/or 106D. Logic signal inputs are provided by power-on reset circuit 108 and VLSI headset state machine 114. In this regard, both power-on reset circuit 108 and headset state machine 114 provide a logic enable signal and a logic disable signal to charge pumps 106. In some embodiments, logic enable signal is a positive voltage signal with a range of 3.3 volts to 5.0 volts, approximately. A logic enable signal at either of input ports 106C/106D activates circuitry within charge pumps 106 to provide a negative voltage bias control signal 103/105 at one of charge pumps 106 output ports 106A/106B, respectively. Negative voltage bias control signal 103/105 is a voltage magnitude sufficient to bias DFET 102/104 into a high impedance OFF state.

In some embodiments, logic disable signal is a negative voltage signal with a range of 0 volts to minus 5.0 volts, approximately. A logic disable signal at either of input ports 106C/106D deactivates circuitry within charge pumps 106 to provide a positive voltage bias control signal 103/105 at one of charge pumps 106 output ports 106A/106B, respectively. Positive voltage bias control signal is a magnitude sufficient to bias DFET 102/104 into a low resistance conductive ON state.

In some embodiments, power-on reset circuit 108 provides logic enable and logic disable signals at charge pumps 106 input port 106C in response to variations in audio system 10 internal power supply voltages VDD1 126, VDD2 128, and VDD3 130. In some embodiments, power supply VDD1 126 provides DC power to a VLSI headset state machine 114 and power supply voltages VDD2 128 and VDD3 130 provide DC power to a headset switching circuit 116. In other embodiments, power-on reset circuit 108 provides logic enable and logic disable signals in response to more or fewer internal power supply voltages VDD1 126 through VDDn 132. Internal power supply voltage signals VDD1, VDD2, and VDDn may be logical AND connected at input ports 117, 119, and 121, respectively. In this regard, when internal power supply voltage signals VDD1-VDD3 exceed their respective low voltage magnitude threshold, power-on reset circuit 108 may produce a logic enable output signal at charge pumps 106 input port 106C, thereby turning off DFET 102 and/or 104 to selectively decouple local ground 107A from headset ground 53. Conversely, when one or more internal power supply voltage signals VDD1-VDD3 fall below their respective low voltage magnitude threshold, power-on reset circuit 108 may produce a logic disable output signal at charge pumps 106 input port 106C, thereby turning on DFET 102 and/or 104 to selectively couple local ground 107A to headset ground 53.

In various embodiments, hum reduction circuit 100 includes a fast pull-up circuit 110. Fast pull-up circuit 110 provides for a fast rise time voltage signal to the gate of DFET switches 102/104 in the event power is removed from audio system 10. Audio components local ground 107B is coupled to headset ground 53 by n-channel field effect transistors (NFETs) 118/120 during normal operation when audio system 10 is powered on. However, when internal power supply voltages VDD1 126, VDD2 128, and/or VDD3 130 are lowered or turned off, NFETs 118/120 turn off causing local ground 107B to decouple from headset ground 53. This momentary loss of ground signal conductivity between local ground and headset ground 53 causes a pop sound at the headset speaker.

To avoid a momentary loss of ground signal conductivity, fast pull-up circuit 110 provides a fast bias voltage pull-up signal 113/115 to gates of DFETs 102/104, respectively, to turn on DFETs 102/104 and couple local ground 107A to headset ground 53. Fast bias voltage pull-up signals 113/115 are a positive voltage magnitude sufficient to bias DFETs 102/104 to a low resistance conductive ON state. Leakage circuit 112 is coupled to gates of DFETs 102/104 to maintain the positive voltage bias on gates of DETs 102/104 to keep DFETs 102/104 turned on while internal power supply voltages VDD1 126, VDD2 128, and/or VDD3 103 are below the low voltage magnitude threshold or are turned off.

In some embodiments, audio system 10 includes jack detection circuit 101. Jack detection circuit 101 may be used to detect a headset type and couple headset ground 53 to audio components local ground 107B through audio system 10 jack contacts HPGNDA 122 and/or HPGNDB 124 as determined by headset detection logic operating in state machine 114. A low resistance ground path from headset ground 53 to local ground 107B is provided by n-channel field effect transistors (NFETs) 118/120 that function as audio ground switches when audio system 10 is powered on.

In one embodiment, jack detection circuit 101 includes VLSI headset state machine 114, headset switching circuit 116, and NFETs 118/120. Jack detection circuit 101 may interface with hum reduction circuit 100 to provide grounding control signals to couple contacts HPGNDA 122 and/or HPGNDB 124 to local grounds 107A and/or 107B in response to detecting and identifying headset 50 during powered on operations.

State machine 114 may include, for example, a microprocessor, a single-core processor, a multi-core processor, a microcontroller, a logic device (e.g., a programmable logic device configured to perform processing operations), a digital signal processing (DSP) device, one or more memories for storing executable instructions (e.g., software, firmware, or other instructions), and/or any other appropriate combination of processing device and/or memory to execute instructions to perform any of the various operations described herein. State machine 114 is adapted to interface and communicate with components 106, 116, 118, 120, 122, and 124 to perform method and processing steps as described herein. In various embodiments, state machine 114 may be adapted to perform various types of jack detection and grounding control techniques as described herein.

Headset switching circuitry 116 may include analog and digital circuits implemented to accept inputs from state machine 114 and provide sensing signals to contacts HPGNDA 122 and HPGNDB 124. For example, state machine 114 may provide a headset_detection sensing signal 129 to switching circuit 116 to determine the type of headset 50, such as an open mobile terminal platform (OMTP) and/or a cellular telephone industries association (CTIA) headset, for example. In some embodiments, headset_detection sensing signal 129 may be coupled to contact HPGNDA 122 to provide headset_detection sensing signal 129 to ring2 of headset plug 54. Ring2 of OMTP headset may be assigned to the microphone and upon detection of OMTP headset, switching circuit 116 may provide a micbias_dtct signal 135 to state machine 114 that OMTP headset is detected. In a similar manner, headset_detection sensing signal 129 may be coupled to contact HPGNDA 124 to provide headset_detection sensing signal 129 to sleeve of headset plug 54. Sleeve of CTIA headset is assigned to the microphone and upon detection of CTIA headset, switching circuit 116 may provide micbias_dtct signal 135 to state machine 114 that CTIA headset is detected.

In some embodiments, state machine 114 may provide switching circuit 116 with a headset select signal in response to receiving micbias_dtct signal 135 from switching circuit 116. For example, if OMTP headset is detected, state machine 114 may provide a headset_sel_b signal 133 to switching circuit 116. Switching circuit 116, in response to headset_sel_b signal 133, may provide a gate electrode of NFET 118 with a positive voltage bias control signal 137 to bias NFET 118 in a conductive ON state to couple local ground 107B to headset ground 53 of OMTP headset through contact HPGNDB 124 and sleeve of headset plug 54. In some embodiments, state machine 114 may provide DFET charge pumps 106 of hum reduction circuit 100 with a logic enable signal 127 to turn off DFET 102 coupled to contact HPGNDA 122, to decouple local ground 107A from headset plug 54 microphone connection of OMTP headset.

In a similar manner, if CTIA headset is detected, state machine 114 may provide a headset_sel_a signal 131 to switching circuit 116. Switching circuit 116, in response to headset_sel_a signal 131, may provide a gate electrode of NFET 120 with a positive voltage bias control signal 139 to bias NFET 120 in a conductive ON state to couple local ground 107B to headset ground 53 of CTIA headset through contact HPGNDA 122 and ring2 of headset plug 54. In some embodiments, state machine 114 may provide DFET charge pumps 106 of hum reduction circuit 100 with logic enable signal 127 to turn off DFET 104 coupled to contact HPGNDB 124, to decouple local ground 107A from headset plug 54 microphone connection of CTIA headset.

In various embodiments, audio system 10, hum reduction circuit 100, and jack detection circuit 101 may be implemented in silicon or other suitable materials, and may be constructed from discrete devices, formed as integrated circuits, or can be constructed in other suitable manners.

Figure 2:
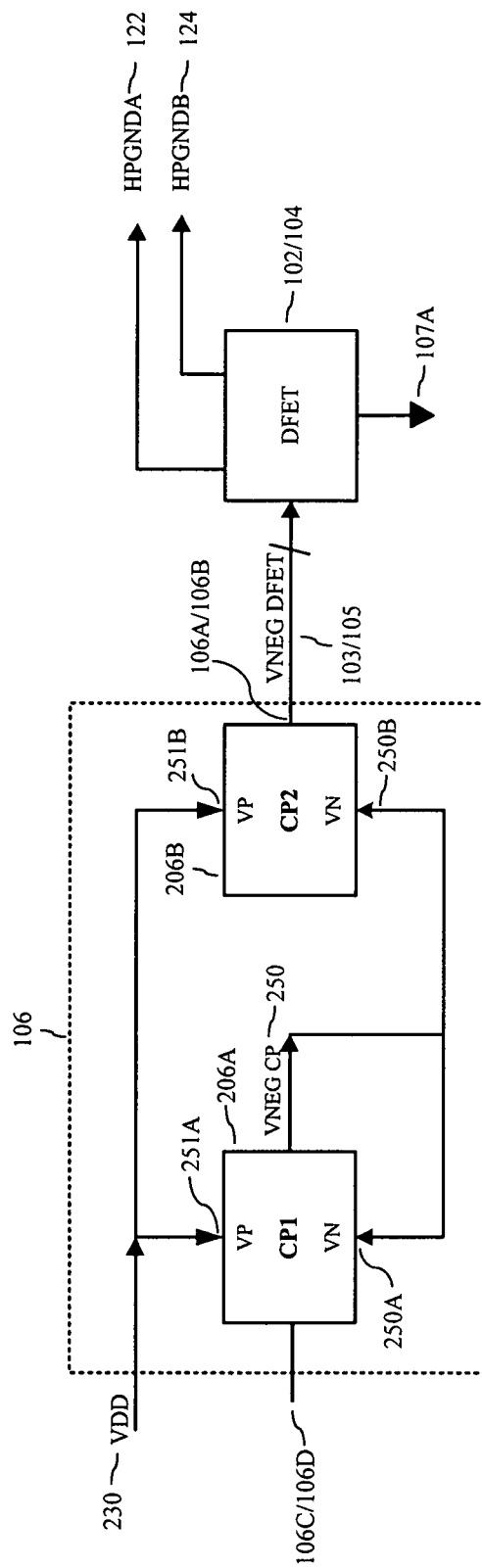
FIG. 2 illustrates a depletion mode field effect transistor (DFET) charge pump circuit coupled to DFET switches in accordance with an embodiment of the disclosure.

FIG. 2 illustrates a depletion mode field effect transistor (DFET) charge pump circuit coupled to DFET switches 102/104 in accordance with an embodiment of the disclosure. DFET charge pumps 106 may be implemented with conventional analog and digital circuits to perform functions associated with DFET charge pumps 106. DFET charge pumps 106 are coupled to DFET switches 102/104 to provide bias control signals to DFET switches 102/104, respectively. A positive power supply voltage 230 as part of audio system 10, powers DFET charge pumps 106. In some embodiments, positive power supply voltage 230 may have a voltage magnitude of approximately positive seven volts. However, in other embodiments positive power supply voltage may have a voltage magnitude more than or less than seven volts.

In some embodiments, DEFT charge pumps 106 include two separate DFET charge pumps, CP1 206A and CP2 206B. First charge pump 206A accepts a positive power supply voltage 230 at a power supply input port 251A. Second charge pump 206B accepts a positive power supply voltage 230 at a power supply input port 251B. Charge pump 206A is implemented with circuitry to produce a negative voltage signal 250 in response to receiving logic enable signal through input port 106C and/or 106D as described herein. Negative voltage signal 250 is provided to second charge pump CP2 206B at a voltage port 250B. Charge pump 206B is implemented with analog and digital circuitry to actively pump a negative voltage bias control signal 103/105 to gates of DFET 102/104, respectively, in response to logic enable signal received through input port 106C and/or 106D as described herein. In this regard, negative voltage bias control signal 103 provides a bias voltage to gate of DFET 102 to turn off DFET 102 and decouple audio jack contact HPGNDA 122 from local ground 107A. Negative voltage bias control signal 105 provides a bias voltage to gate of DFET 104 to turn off DFET 104 and decouple audio jack contact HPGNDB 124 from local ground 107A.

It will be appreciated second charge pump 206B reduces noise produced by first charge pump 206A from coupling to the gates of DFETs 102/104. In this regard, switching noise from charge pump 206A operation may couple to DFET charge pumps output ports 106A/106B and eventually to HPGNDA 122 and HPGNDB 124. Second charge pump 206B may operate without switching circuits and may decouple the switching noise produced by charge pump 206A from local ground 107A and headset ground 53.

Figure 3:
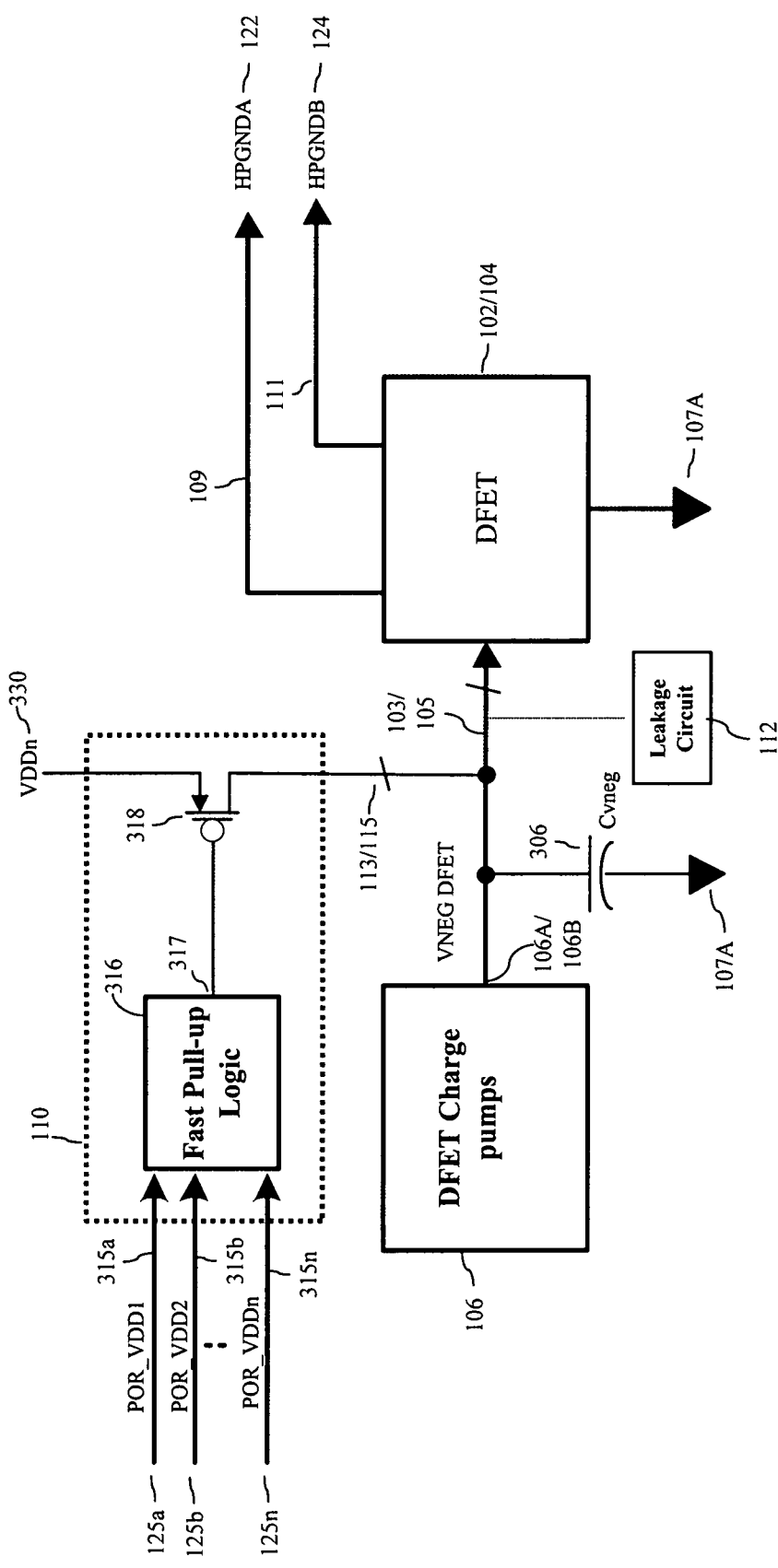
FIG. 3 illustrates a fast pull-up circuit in accordance with an embodiment of the disclosure.

FIG. 3 illustrates a fast pull-up circuit 110 in accordance with an embodiment of the disclosure. Fast pull-up circuit 110 includes a fast pull-up circuit 316 and a p-channel enhancement mode metal-oxide-semiconductor field-effect transistor (MOSFET) 318. Fast pull-up circuit 110 is coupled to gates of DFETs 102/104 to provide bias control signals 103/105 with a fast voltage rise time to quickly turn on DFETs 102/104 and couple local ground 107A to headset ground 53 through contacts HPGNDA 122/HPGNDB 124. A fast voltage rise time at bias control signals 103/105 reduces or removes a popping sound heard in headset 50 when headset ground 53 floats momentarily while DFETs 102/104 are turning on.

In some embodiments, fast pull-up circuit 110 may be implemented with conventional analog and digital circuits to perform operations associated with fast pull-up circuit 110. In some embodiments, fast pull-up circuit 316 is implemented with a logic circuit that includes an inverter implemented with a fast pull-up output. Fast pull-up circuit 316 responds quickly to a high to low transition of at least one of POR_VDD1 125a, POR_VDD1 125b, through POR_VDDn 125n voltage signals at input ports 315a, 315b through 315n of fast pull-up circuit 316. In some embodiments, in response to a high to low transition voltage at one or more input ports 315a, 315b through 315n, fast pull-up circuit 316 provides a DC ground signal 317 to a gate of MOSFET 318 to bias MOSFET 318 in a low resistance conductive ON state. In other embodiments, fast pull-up circuit 316 provides a negative voltage signal to the gate of MOSFET 318 to bias MOSFET 318 in a low resistance conductive ON state. A source of MOSFET 318 is coupled to a positive voltage VDDn 330, provided by audio system 10, to provide a fast bias voltage pull-up signal 113/115 to quickly pull-up positive control signal 103/105 of DFET charge pumps 106 outputs 106A/106B. Leakage circuit 112 and Cvneg capacitor 306, coupled to local ground 107A, maintain DFETs 102/104 in the conductive ON state during the time one or more internal power supplies VDD1 through VDDn is below its respective low voltage magnitude threshold or is turned off.

Figure 4:
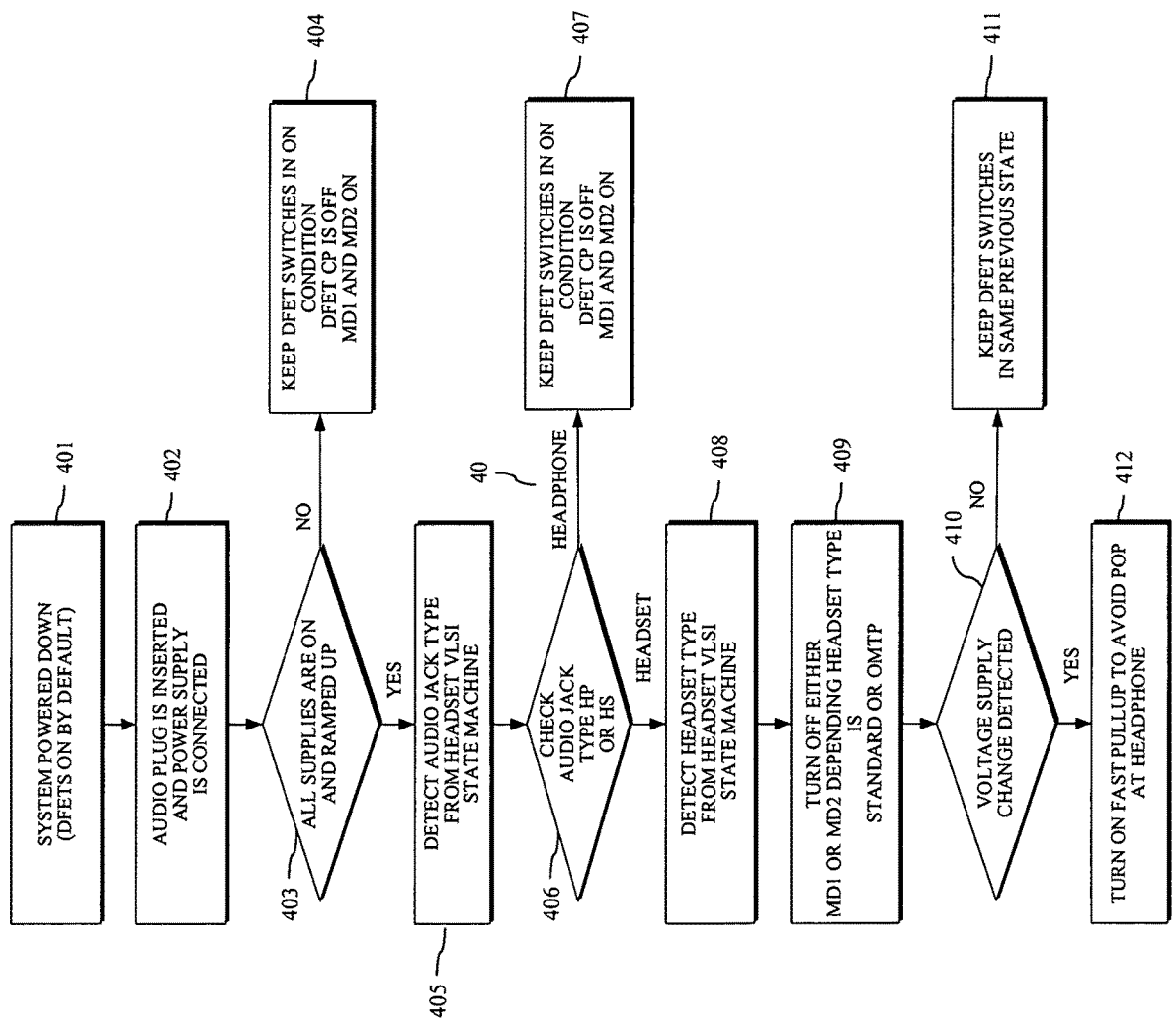
FIG. 4 illustrates a flow diagram of an operation of a hum reduction circuit in accordance with an embodiment of the disclosure.

FIG. 4 illustrates a flow diagram of an operation of a hum reduction circuit 100 in accordance with an embodiment of the disclosure. In describing the flow diagram of hum reduction circuit 100, reference may be made to one or more of FIGS. 1-3. Furthermore, steps of FIG. 4 may be performed in an order different than that discussed herein.

In block 401, the flow diagram begins with audio system 10, hum reduction circuit 100, and jack detection circuit 101 powered off with internal power supply voltages VDD1 126, VDD2 128, and VDD3 130 of FIG. 1 turned off. DFET switches 102 and 104 are in a low resistance conductive ON state providing an electrical conductive path from contact HPGNDA 122 and contact HPGNDB 124, respectively, to local ground 107A.

In block 402, a headset plug 54 electrically contacts HPGNDA 122 and HPGNDB 124. In addition, internal power supply voltages VDD1 126, VDD2 128, and VDD3 130 are turned on and provide voltage signals to audio components of audio system 10.

In block 403, audio system 10 determines if internal power supply voltages VDD1 126, VDD2 128, and VDD3 130 are at a nominal operating voltage level. If internal power supply voltages are not at a nominal operating voltage level, the flow proceeds to block 404.

In block 404, DFET switches 102 and 104 are maintained in a low resistance conductive ON state until internal power supply voltages VDD1 126, VDD2 128, and VDD3 130 are at a nominal operating voltage level. The flow then proceeds to block 405.

In block 405, jack detection circuit 101 detects the type of headset plug 54 that is in electrical contact with contacts HPGNDA 122 and HPGNDB 124. In this regard, state machine 114 may provide a headset_detection sensing signal 129 to switching circuit 116 to determine the type of headset 50, such as an OMTP headset, a CTIA headset, or a headphone 40.

In block 406, switching circuit 116 may provide a micbias_dtct signal 135 to state machine 114 in response to headset_detection sensing signal 129. In this regard, micbias_dtct signal 135 may provide electrical signal information that a headset 50 is detected or may provide electrical signal information that a headphone 40 is detected. IF headphone 40 is detected, the flow proceeds to block 407.

In block 407, when headphone 40 is detected, state machine provides a disable bias control signal (e.g., enable signal 127) to DFET charge pumps 106. In response, DFET charge pumps 106 may provide DFETs 102 and 104 with positive voltage bias control signals 103 and 105. DFETs 102 and 104 are held in a low resistance conductive ON state to provide an electrical conductive path from contact HPGNDA 122 and contact HPGNDB 124, respectively, to local ground 107A.

In block 408, when headset 50 is detected, state machine 114 determines the type of headset 50, such as an OMTP headset or a CTIA headset. In this regard, headset_detection sensing signal 129 may be coupled to contact HPGNDA 124 to provide headset_detection sensing signal 129 to sleeve of headset plug 54. Sleeve of CTIA headset is assigned to the microphone and upon detection of CTIA headset, switching circuit 116 may provide micbias_dtct signal 135 to state machine 114 that CTIA headset is detected.

In a similar manner, headset_detection sensing signal 129 may be coupled to contact HPGNDA 122 to provide sensing signal 129 to ring2 of headset plug 54. Ring2 of OMTP headset is assigned to the microphone and upon detection of OMTP headset, switching circuit 116 may provide a micbias_dtct signal 135 to state machine that OMTP headset is detected.

In block 409, based on the headset type detected (e.g., such as CTIA headset or OMTP headset) in block 408, state machine 114 may provide a logic enable signal 127 to DFET charge pumps 106 for DFET charge pumps 106 to provide a negative voltage bias control signal 103 or 105 to turn off DFET 102 or DFET 104 coupled to the microphone contact of the headset 50 detected. In this regard, the microphone contact (e.g., contact HPGNDA 122 or contact HPGNDA 124) of the detected headset may not be grounded.

In block 410, power-on reset circuit 108 may detect a low voltage magnitude threshold of one or more internal power supply voltages VDD1 126, VDD2 128, and VDD3 130 at one or more input ports 117, 119, and 121 of power-on reset circuit 108. If a low voltage magnitude threshold is not detected, flow diagram proceeds to block 411.

In block 411, DFETs 102 and 104 are maintained in the state according to block 409. If a low voltage magnitude threshold is detected, flow diagram proceeds to block 412.

In block 412, fast pull-up circuit 110 is coupled to gates of DFETs 102/104 to provide bias control signals 103/105 with a fast voltage rise time to quickly turn on DFETs 102/104 and couple local ground 107A to headset ground 53 through contacts HPGNDA 122/HPGNDB 124. In this regard, a popping sound in headset 50 may be avoided by minimizing the time headset ground 53 floats while DFETs 102/104 are turning on.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

Software, in accordance with the present disclosure, such as program code and/or data, may be stored on one or more computer readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A system comprising:
   an audio jack adapted to accept an audio plug comprising a first electrical ground connection;
   a switch coupled to the audio jack at a first end and coupled to a second electrical ground connection at a second end, wherein the switch is configured to couple to the first electrical ground connection at the first end;
   a charge pump circuit coupled to the switch and configured to generate a bias control signal to control a switch bias, wherein a first switch bias electrically couples the first electrical ground connection to the second electrical ground connection, and wherein a second switch bias electrically decouples the first electrical ground connection from the second electrical ground connection; and
   a fast pull-up circuit coupled to a gate of the switch and configured to pull up a voltage at the gate before the charge pump circuit generates the bias control signal.

2. The system of claim 1, wherein the charge pump circuit comprises a first charge pump circuit in series with a second charge pump circuit;
   wherein the bias control signal comprises a negative voltage bias control signal and a positive bias control signal;
   wherein the charge pump circuit is further configured to provide the negative voltage bias control signal to the switch to electrically decouple the first electrical ground connection from the second electrical ground connection; and
   wherein the charge pump circuit is further configured to provide the positive voltage bias control signal to the switch to electrically couple the first electrical ground to the second electrical ground.

3. The system of claim 2, further comprising a state machine coupled to the charge pump circuit and configured to detect, at the audio jack, at least one of a first audio plug corresponding to a first headset type and a second audio plug corresponding to a second headset type, wherein the state machine provides a first enable signal to the charge pump circuit when the first audio plug is detected to reduce low frequency ground noise, and wherein the state machine provides a first disable signal to the charge pump circuit when the second audio plug is detected.

4. The system of claim 3, wherein the system further comprises a power-on reset circuit coupled to the charge pump circuit and at least one power supply voltage signal at a corresponding input port of the power-on reset circuit, the power-on reset circuit configured to provide a second disable signal to the charge pump circuit in response to variations in the at least one power supply voltage signal; and
   wherein the at least one power supply voltage signal corresponds to an internal power supply voltage supplied to the state machine and/or a headset switching circuit.

5. The system of claim 1, wherein the switch comprises a depletion n-channel field effect transistor comprising a drain, a source, and a gate, wherein the drain is coupled to the first electrical ground connection at the audio jack, the source is coupled to the second electrical ground connection, and the gate is coupled to the bias control signal, and wherein the depletion n-channel field effect transistor is configured to electrically couple the first electrical ground connection to the second electrical ground connection when no bias control signal is present at the gate.

6. The system of claim 5, wherein the fast pull-up circuit is coupled to the gate of the depletion n-channel field effect transistor and is configured to provide a fast rise time voltage signal at the gate to pull up the voltage at the gate before the charge pump circuit generates the bias control signal to turn on the depletion n-channel field effect transistor, and wherein the system further comprises a leakage circuit coupled to the gate of the depletion n-channel field effect transistor, wherein the leakage circuit is configured to maintain the bias control signal at the gate to electrically couple the first electrical ground to the second electrical ground in response to a power supply voltage signal being below a threshold voltage.

7. The system of claim 1, wherein the audio jack is configured as an audio device jack of an audio codec to accept at least one of an open mobile terminal platform (OMTP) plug and a cellular telephone industries association (CTIA) plug.

8. The system of claim 7, wherein the audio codec is coupled to the second electrical ground connection.

9. The system of claim 7, wherein the at least one of the OMTP plug and the CTIA plug is coupled to the first electrical ground.

10. The system of claim 1, further comprising a direct current (DC) powered speaker coupled to the first electrical ground connection.

11. A method comprising:
   accepting at an audio jack, by an audio plug coupled to the audio jack, a first electrical ground connection;
   receiving, at a first end of a switch coupled to the audio jack, the first electrical ground connection;
   coupling, at a second end of the switch, a second electrical ground connection;
   providing, by a charge pump circuit coupled to the switch, a bias control signal coupled to the switch to control a switch bias;
   electrically coupling, by a first switch bias, the first electrical ground connection to the second electrical ground connection;
   electrically decoupling, by a second switch bias, the first electrical ground connection from the second electrical ground connection; and
   pulling up, by a fast pull-up circuit coupled to a gate of the switch, a voltage at the gate before the charge pump circuit provides the bias control signal.

12. The method of claim 11, further comprising:
   providing, by the charge pump circuit coupled to the switch, a negative voltage bias control signal to decouple the first electrical ground connection from the second electrical ground connection in response to a first enable signal, and
   providing, by the charge pump circuit coupled to the switch, a positive voltage bias control signal to couple the first electrical ground connection to the second electrical ground connection in response to a first disable signal, wherein the charge pump circuit comprises a first charge pump circuit in series with a second charge pump circuit.

13. The method of claim 12, further comprising detecting, by a state machine coupled to the charge pump circuit, at least one of a first audio plug and a second audio plug coupled to the audio jack, wherein the state machine provides the first enable signal to the charge pump circuit when the first audio plug is detected, and wherein the state machine provides the first disable signal to the charge pump circuit when the second audio plug is detected.

14. The method of claim 12, further comprising:
   providing, by a power-on reset circuit coupled to the charge pump circuit, a second disable signal in response to a power supply voltage signal at one or more input ports of the power-on reset circuit, wherein the providing the second disable single further comprises:
      receiving at least one of power supply voltage signal corresponding to an internal power supply voltage supplied to the state machine and/or a headset switching circuit; and
      providing the second disable signal to the charge pump circuit in response to variations in the at least one power supply voltage signal.

15. The method of claim 11, wherein the switch is configured as a depletion n-channel field effect transistor comprising a drain, a source, and a gate, and wherein the drain is coupled to the first electrical ground connection at the audio jack, the source is coupled to the second electrical ground connection, and the gate is coupled to the bias control signal, the method further comprising electrically coupling the first electrical ground connection to the second electrical ground connection when no bias control signal is present at the gate.

16. The method of claim 15, wherein the pulling up the voltage at the gate comprises providing a fast rise time voltage signal to the gate to pull up the voltage at the gate to electrically couple the first electrical ground connection to the second electrical ground connection before the charge pump circuit provides the bias control signal, and
   maintaining, by a leakage circuit coupled to the gate of the depletion n-channel field effect transistor, the bias control signal at the gate to electrically couple the first electrical ground to the second electrical ground in response to a power supply voltage signal being below a threshold voltage.

17. The method of claim 11, wherein the audio jack is configured as an audio device jack of an audio codec to accept at least one of an open mobile terminal platform (OMTP) plug and a cellular telephone industries association (CTIA) plug.

18. The method of claim 17, wherein the audio codec is coupled to the second electrical ground connection.

19. The method of claim 17, wherein the at least one of the OMTP plug and the CTIA plug is coupled to the first electrical ground connection.

20. The method of claim 11, further comprising a direct current (DC) powered speaker coupled to the first electrical ground connection.

\* \* \* \* \*